United States Patent
Cho et al.

(10) Patent No.: US 8,154,020 B2
(45) Date of Patent: Apr. 10, 2012

(54) PHOTO-VOLTAIC CELL DEVICE AND DISPLAY PANEL

(75) Inventors: An-Thung Cho, Hualien County (TW); Chia-Tien Peng, Hsinchu County (TW); Yu-Cheng Chen, Hsinchu (TW); Hong-Zhang Lin, Taichung (TW); Yi-Chien Wen, Taipei (TW); Wei-Min Sun, Taipei (TW); Chi-Mao Hung, Chiayi (TW); Chun-Hsiun Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 246 days.

(21) Appl. No.: 12/464,118

(22) Filed: May 12, 2009

(65) Prior Publication Data

US 2010/0163873 A1  Jul. 1, 2010

(30) Foreign Application Priority Data

Dec. 25, 2008  (TW) ................................ 97150761 A

(51) Int. Cl.
*H01L 29/786* (2006.01)
(52) U.S. Cl. ........... 257/53; 257/E33.003; 257/E33.004; 257/E33.077; 438/57
(58) Field of Classification Search .............. 257/53; 438/57; 349/116
See application file for complete search history.

(56) References Cited

U.S. PATENT DOCUMENTS

| | | | | |
|---|---|---|---|---|
| 5,419,783 A | * | 5/1995 | Noguchi et al. | 438/93 |
| 5,976,906 A | * | 11/1999 | Takada et al. | 438/48 |
| 6,472,594 B1 | * | 10/2002 | Ichinose et al. | 136/256 |
| 6,903,425 B2 | | 6/2005 | Tang et al. | |
| 7,297,642 B2 | | 11/2007 | Gao et al. | |
| 2006/0237809 A1 | | 10/2006 | Bhattacharyya | |
| 2007/0052004 A1 | * | 3/2007 | Chao et al. | 257/315 |
| 2008/0121279 A1 | * | 5/2008 | Swanson | 136/258 |
| 2008/0179762 A1 | * | 7/2008 | Cho et al. | 257/E31.001 |
| 2008/0303018 A1 | * | 12/2008 | Kim et al. | 257/13 |
| 2009/0009675 A1 | | 1/2009 | Cho et al. | |
| 2009/0185120 A1 | * | 7/2009 | Yoon et al. | 349/116 |
| 2009/0278121 A1 | * | 11/2009 | Kakkad et al. | 257/43 |
| 2009/0283850 A1 | * | 11/2009 | Cho et al. | 257/466 |
| 2010/0315580 A1 | * | 12/2010 | Cho et al. | 349/116 |

OTHER PUBLICATIONS

Luna-Lopez et al.,"Optical and electrical properties of silicon rich oxides for optical sensors" ScienceDirect (2006) 278-282.*
Josiek "Nonstoichiometry and noncrystalization of silicon-rich silicon carbide deposited by CVP" Elsevier (19960 261-267.*
"2nd Office Action of China Counterpart Application" issued on Aug. 17, 2010, p. 1-p. 5, in which the listed reference was cited.

* cited by examiner

*Primary Examiner* — Ahmed Sefer
(74) *Attorney, Agent, or Firm* — Jianq Chyun IP Office

(57) ABSTRACT

A photo-voltaic cell device includes a first electrode, an N-type doped silicon-rich dielectric layer, a P-type doped silicon-rich dielectric layer, and a second electrode. The N-type doped silicon-rich dielectric layer is disposed on the first electrode, and the N-type doped silicon-rich dielectric layer is doped with an N-type dopant. The P-type doped silicon-rich dielectric layer is disposed on the N-type doped silicon-rich dielectric layer, and the P-type doped silicon-rich dielectric layer is doped with a P-type dopant. The second electrode is disposed on the P-type doped silicon-rich dielectric layer. A display panel including the photo-voltaic cell device is also provided.

23 Claims, 5 Drawing Sheets

PHOTO-VOLTAIC CELL DEVICE AND DISPLAY PANEL

CROSS-REFERENCE TO RELATED APPLICATION

This application claims the priority benefit of Taiwan application serial no. 97150761, filed Dec. 25, 2008. The entirety of the above-mentioned patent application is hereby incorporated by reference herein and made a part of specification.

BACKGROUND OF THE INVENTION

1. Field of the Invention

The present invention relates to a photo-voltaic device and a display apparatus, and more particularly to a photo-voltaic cell device and a display panel.

2. Description of Related Art

In general, a photo-voltaic cell device is often made of silicon or group III-V semiconductors. After the photo-voltaic cell device is irradiated, free electron-hole pairs are generated in a material layer of the photo-voltaic cell device, and charges are separated because of electric field effects, so as to form a semiconductor device having a voltage difference caused by the electric field effects. Operation principles of the photo-voltaic cell device are associated with the semiconductor energy band theory, conduction of carriers in semiconductor materials, P-N (positive-negative type) diode properties, and so on.

FIG. 1 is a schematic structural view of a conventional photo-voltaic cell device. Referring to FIG. 1, the conventional photo-voltaic cell device 100 includes a first electrode 110, a P-type semiconductor layer 120 such as a P-type silicon layer, an N-type semiconductor layer 130 such as an N-type silicon layer, and a second electrode 140. The P-type silicon layer 120 is disposed on the first electrode 110, and the N-type silicon layer 130 is disposed on the P-type silicon layer 120. The second electrode 140 is disposed on the N-type silicon layer 130.

Normally, the P-type silicon layer 120 and the N-type silicon layer 130 are made of a silicon material doped with a dopant, such as an amorphous silicon layer or a doped polysilicon layer. A so-called P/N junction or a depletion region is formed at a junction of the P-type silicon layer 120 and the N-type silicon layer 130. Therefore, when the depletion region or the P-type and N-type silicon layers 120 and 130 are irradiated, the energy from the light results in separation of positive and negative charges in the depletion region; namely, additional free electron-hole pairs are generated. The positive charges $h^+$ (holes) and the negative charges $e^-$ (electrons) are seperated and respectively moved towards the positive doped layer (the P-type silicon layer 120) and the negative doped layer (the N-type silicon layer 130) and aggregate. As such, when a load circuit is connected to the first electrode 110 and the second electrode 140, a photo-voltaic current is introduced to drive the load circuit.

Nonetheless, the photo-voltaic cell device mainly made of silicon (e.g. a silicon photo-voltaic cell device or a polysilicon photo-voltaic cell device) has a photo-voltaic conversion efficiency at approximately 15% in average. The silicon photo-voltaic cell device is easily to be decayed by the sunlight or external thermal energy due to silicon recrystalline or rearrangement. As a result, how to develop a novel type of film layer material for improving the photo-voltaic conversion efficiency and lifetime of the photo-voltaic cell device has always attracted people's attention.

SUMMARY OF THE INVENTION

In view of the foregoing, the present invention is directed to a photo-voltaic cell device with favorable photo-voltaic conversion efficiency and longer lifetime.

The present invention is further directed to a display panel capable of integrating the photo-voltaic cell device thereinto and utilizing electric energy obtained during a photo-sensing operation of the photo-voltaic cell device, so as to reduce power consumption.

In the present invention, a photo-voltaic cell device including a first electrode, an N-type doped silicon-rich dielectric layer, a P-type doped silicon-rich dielectric layer, and a second electrode is provided. The N-type doped silicon-rich dielectric layer is disposed on the first electrode, and the N-type doped silicon-rich dielectric layer is doped with an N-type dopant. The P-type doped silicon-rich dielectric layer is disposed on the N-type doped silicon-rich dielectric layer, and the P-type doped silicon-rich dielectric layer is doped with a P-type dopant. The second electrode is disposed on the P-type doped silicon-rich dielectric layer.

According to an embodiment of the present invention, the photo-voltaic cell device further includes an intrinsic layer. The intrinsic layer is disposed between the N-type doped silicon-rich dielectric layer and the P-type doped silicon-rich dielectric layer.

In the present invention, another photo-voltaic cell device including a first electrode, an intrinsic layer, an N-type doped silicon-rich dielectric layer, a P-type doped silicon-rich dielectric layer, and a second electrode is provided. The N-type doped silicon-rich dielectric layer is disposed on the first electrode, and the N-type doped silicon-rich dielectric layer is doped with an N-type dopant. The intrinsic layer is disposed on the N-type doped silicon-rich dielectric layer. The P-type doped silicon-rich dielectric layer is disposed on the intrinsic layer, and the P-type doped silicon-rich dielectric layer is doped with a P-type dopant. The second electrode is disposed on the P-type doped silicon-rich dielectric layer.

In the present invention, still another photo-voltaic cell device including a first electrode, a second electrode, an N-type doped silicon-rich dielectric layer, and a P-type doped silicon-rich dielectric layer is provided. The N-type doped silicon-rich dielectric layer is disposed between the first electrode and the second electrode, and the N-type doped silicon-rich dielectric layer is doped with an N-type dopant. The P-type doped silicon-rich dielectric layer is disposed between the N-type doped silicon-rich dielectric layer and the second electrode, and the P-type doped silicon-rich dielectric layer is doped with a P-type dopant.

According to an embodiment of the present invention, a material of an intrinsic layer in the photo-voltaic cell device includes amorphous silicon, polysilicon, a silicon-rich dielectric layer, or a combination thereof.

According to an embodiment of the present invention, the silicon-rich dielectric layer includes a silicon-rich silicon oxide (Si-rich $SiO_x$) layer, a silicon-rich silicon nitride (Si-rich $SiN_y$) layer, a silicon-rich silicon oxynitride (Si-rich $SiO_xN_y$) layer, a silicon-rich silicon carbide (Si-rich $SiC_z$) layer, a silicon-rich silicon hydrogenated oxide (Si-rich $SiH_wO_x$) layer, a silicon-rich silicon hydrogenated nitride (Si-rich $SiH_wN_y$) layer, a silicon-rich silicon hydrogenated oxynitride (Si-rich $SiH_wO_xN_y$) layer, or a combination thereof.

According to an embodiment of the present invention, the N-type doped silicon-rich dielectric layer and the P-type doped silicon-rich dielectric layer further include silicon nanoparticles.

According to an embodiment of the present invention, at least one of the first electrode and the second electrode is a transparent electrode.

According to an embodiment of the present invention, the N-type dopant includes nitrogen, phosphorous, arsenic, antimony, or bismuth.

According to an embodiment of the present invention, the P-type dopant includes boron, aluminum, gallium, indium, or thallium.

In the present invention, a display panel having a pixel region and a sensing region is further provided. The display panel includes a first substrate, a second substrate, and a display medium. A pixel array and at least a photo-voltaic cell device are disposed on the first substrate. The pixel array is disposed in the pixel region and includes a plurality of thin film transistors (TFTs) and a plurality of pixel electrodes electrically connected to the TFTs. The photo-voltaic cell device is disposed in the sensing region and includes a first electrode, a first silicon-rich dielectric layer, a second silicon-rich dielectric layer, and a second electrode. The first silicon-rich dielectric layer is disposed on the first electrode, and the first silicon-rich dielectric layer is doped with a first-type ion. The second silicon-rich dielectric layer is disposed on the first silicon-rich dielectric layer, and the second silicon-rich dielectric layer is doped with a second-type ion. The second electrode is disposed on the second silicon-rich dielectric layer. The second substrate is disposed opposite to the first substrate. The display medium is sandwiched between the first substrate and the second substrate.

According to an embodiment of the present invention, the pixel electrodes of the pixel array and the second electrode of the photo-voltaic cell device are made in the same film layer.

According to an embodiment of the present invention, source electrodes and drain electrodes of the TFTs of the pixel array and the first electrode of the photo-voltaic cell device are made in the same film layer.

According to an embodiment of the present invention, the TFTs include amorphous silicon TFTs or polysilicon TFTs.

To sum up, after the N-type doped silicon-rich dielectric layer is irradiated or after the P-type doped silicon-rich dielectric layer is irradiated, the free electron-hole pairs can be generated. Besides, since the N-type doped silicon-rich dielectric layer and the P-type doped silicon-rich dielectric layer are doped with different ions, an internal electric field exists between the N-type doped silicon-rich dielectric layer and the P-type doped silicon-rich dielectric layer, such that the electrons and the holes are respectively attracted and moved to the P-type doped silicon-rich dielectric layer and the N-type doped silicon-rich dielectric layer. Thus, a spontaneous photo-voltaic current can be generated after the photo-voltaic cell device is irradiated. That is to say, the photo-voltaic cell device of the present invention has favorable photo-voltaic conversion efficiency and longer lifetime with satisfactory structural stability. On the other hand, a required thickness of a film layer in the photo-voltaic cell device is relatively smaller and thinner (e.g. 100 nm~500 nm), and therefore the photo-voltaic cell device of the present invention is adapted to be integrated into a process of fabricating a display panel. Thereby, the electric energy obtained during a photo-sensing operation of the photo-voltaic cell device can be utilized by the display panel, so as to reduce power consumption.

In order to make the aforementioned and other features and advantages of the present invention more comprehensible, embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

First Embodiment

Figure 1:
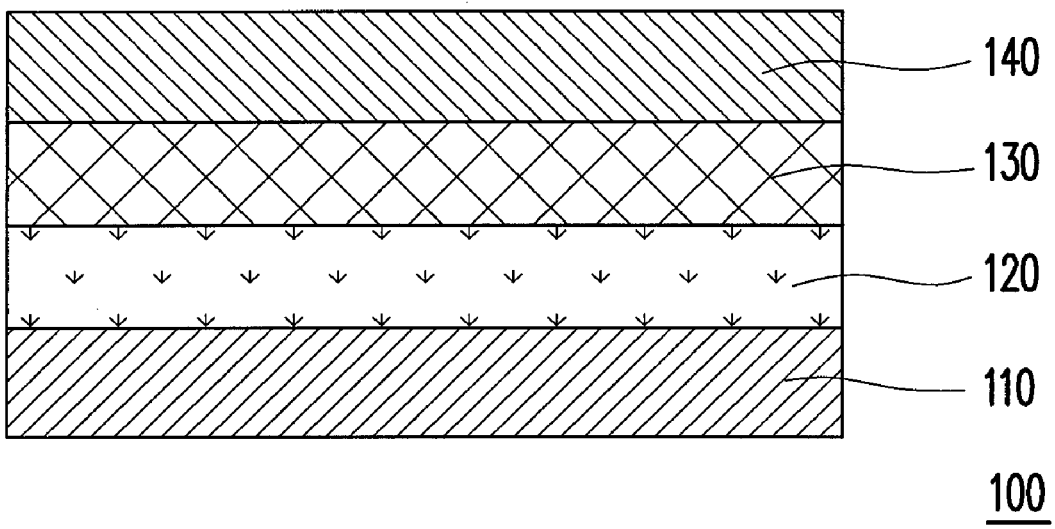
FIG. 1 is a schematic structural view of a conventional photo-voltaic cell device.
Figure 2:
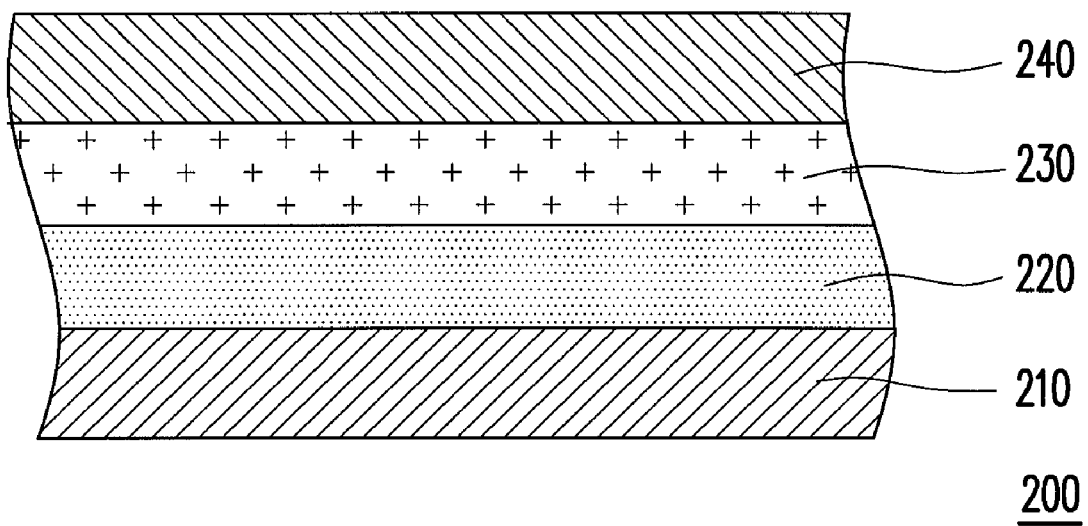
FIG. 2 is a schematic structural view of a photo-voltaic cell device according to a first embodiment of the present invention.

FIG. 2 is a schematic structural view of a photo-voltaic cell device according to a first embodiment of the present invention. Referring to FIG. 2, the photo-voltaic cell device 200 of the present embodiment includes a first electrode 210, an N-type doped silicon-rich dielectric layer 220, a P-type doped silicon-rich dielectric layer 230, and a second electrode 240. The N-type doped silicon-rich dielectric layer 220 is disposed on the first electrode 210, and the N-type doped silicon-rich dielectric layer 220 is doped with an N-type dopant. The P-type doped silicon-rich dielectric layer 230 is disposed on the N-type doped silicon-rich dielectric layer 220, and the P-type doped silicon-rich dielectric layer 230 is doped with a P-type dopant. The second electrode 240 is disposed on the P-type doped silicon-rich dielectric layer 230.

Said vertical design can also be changed to a horizontal design or a lateral design (not shown) in an modified embodiment of the present invention, and the photo-voltaic cell device 200 herein includes a first electrode 210 and a second electrode 240 horizontally arranged opposite to each other. The N-type doped silicon-rich dielectric layer 220 is disposed between the first electrode 210 and the second electrode 240, and the N-type doped silicon-rich dielectric layer 220 is doped with an N-type dopant. The P-type doped silicon-rich dielectric layer 230 is disposed between the N-type doped silicon-rich dielectric layer 220 and the second electrode 240, and the P-type doped silicon-rich dielectric layer 230 is doped with a P-type dopant.

In an embodiment of the present invention, the N-type doped silicon-rich dielectric layer 220 and the P-type doped silicon-rich dielectric layer 230 are formed by performing a chemical vapor deposition (CVD) process. Besides, gas proportion in said fabricating process is controlled, such that silicon exceeds a normal chemical proportion (stoichiometry), and a silicon-rich dielectric layer is further formed. For instance, a material of the silicon-rich dielectric layer is Si-rich $SiO_x$, Si-rich $SiN_y$, Si-rich $SiO_xN_y$, Si-rich $SiC_z$, Si-rich $SiH_wO_x$, Si-rich $SiH_wN_y$, Si-rich $SiH_wO_xN_y$, or a combination thereof, for example, wherein $0<w<4$, $0<x<2$, $0<y<1.34$, and $0<z<1$. Alternatively, the silicon-rich dielectric layer is a dielectric layer in which silicon exceeds normal stoichiometry. The above description is merely exemplary and should not be construed as a limitation to the present invention. According to the present embodiment, the silicon-rich dielectric layer can be considered as a photo-sensitive dielectric layer. In other words, when the silicon-rich dielectric layer is irradiated, free electron-hole pairs ($e^-$ and $h^+$) are adapted to be generated in the silicon-rich dielectric layer. Thereafter, an ion implantation process is performed, such that the silicon-rich dielectric layer is doped with the N-type dopant and the P-type dopant, and the aforesaid N-type doped silicon-rich dielectric layer 220 and the aforesaid P-type doped silicon-rich dielectric layer 230 are respectively formed. Here, the N-type dopant includes group V A elements, such as nitrogen (N), phosphorous (P), arsenic (As), antimony (Sb), bismuth (Bi), or the like. Besides, the P-type dopant includes group III A elements, such as boron (B), aluminum (Al), gallium (Ga), indium (In), thallium (Tl), or the like.

In another embodiment, the N-type doped silicon-rich dielectric layer 220 and the P-type doped silicon-rich dielectric layer 230 are formed by performing an in-situ doped CVD process for fabricating a silicon-rich dielectric layer, and a dopant is implanted during the CVD process. As such, the dielectric layer formed by performing said in-situ doped CVD process is the silicon-rich dielectric layer doped with the N-type dopant or the P-type dopant.

For instance, conditions of fabricating the N-type doped silicon-rich dielectric layer 220 through implementing the CVD process include a pressure ranging from 800 mtor to 1500 mtor and an output power at 300 W~1000 W. On these conditions, when reactive gases including silane ($SiH_4$), nitrous oxide ($N_2O$), phosphorus hydride ($PH_3$), and hydrogen ($H_2$) are introduced, an N-type doped Si-rich $SiO_x$ layer is formed by deposition. By contrast, when reactive gases ($SiH_4$, $NH_3$, $PH_3$, and $H_2$) are introduced, an N-type doped Si-rich $SiN_y$ layer is formed by deposition. Likewise, when reactive gases ($SiH_4$, $N_2O$, $NH_3$, $PH_3$, and $H_2$) are introduced, and the ratio of $NH_3$ (ammonia) to $N_2O$ by volume is 100~600, for example, an N-type doped Si-rich $SiO_xN_y$ layer is formed by deposition. In the present embodiment, the ratio of $NH_3$ to $N_2O$ by volume is 100. Here, the gas flow rate of $SiH_4$ is 100 sccm~1500 sccm (standard cubic centimeter per minute), the gas flow rate of $N_2O$ is 10 sccm~600 sccm, the gas flow rate of $NH_3$ is 10 sccm~600 sccm, the gas flow rate of $PH_3$ is 10 sccm~2000 sccm, and the gas flow rate of $H_2$ is 100 sccm~4000 sccm, for example. Said manufacturing conditions are merely exemplary and should not be construed as a limitation to the present invention. The proportion of the introduced gases can be adjusted upon actual demands.

For instance, conditions of fabricating the P-type doped silicon-rich dielectric layer 230 through implementing the CVD process include a pressure ranging from 800 mtor to 1500 mtor and an output power at 300 W~1000 W. On these conditions, when reactive gases including silane ($SiH_4$), nitrous oxide ($N_2O$), boron hydride ($B_2H_6$), and hydrogen ($H_2$) are introduced, a P-type doped Si-rich $SiO_x$ layer is formed by deposition. By contrast, when reactive gases ($SiH_4$, $NH_3$, $B_2H_6$, and $H_2$) are introduced, a P-type doped Si-rich $SiN_y$ layer is formed by deposition. Likewise, when reactive gases ($SiH_4$, $N_2O$, $NH_3$, $B_2H_6$, and $H_2$) are introduced, and the ratio of $NH_3$ to $N_2O$ by volume is 100~600, for example, a P-type doped Si-rich $SiO_xN_y$ layer is formed by deposition. In the present embodiment, the ratio of $NH_3$ to $N_2O$ by volume is 100. Here, the gas flow rate of $SiH_4$ is 100 sccm~1500 sccm, the gas flow rate of $N_2O$ is 10 sccm~600 sccm, the gas flow rate of $NH_3$ is 10 sccm~600 sccm, the gas flow rate of $B_2H_6$ is 100 sccm~2000 sccm, and the gas flow rate of $H_2$ is 100 sccm~4000 sccm, for example. Said manufacturing conditions are merely exemplary and should not be construed as a limitation to the present invention. The proportion of the introduced gases can be adjusted upon actual demands.

According to another embodiment of the present invention, the N-type doped silicon-rich dielectric layer 220 and the P-type doped silicon-rich dielectric layer 230 further include silicon nanoparticles or silicon nano-dots therein. Specifically, after the N-type doped silicon-rich dielectric layer 220 and the P-type doped silicon-rich dielectric layer 230 are formed by applying said method, a laser annealing process can be further performed by using excimer laser, green laser, pulse laser, or laser at different wavelengths, so as to form the silicon nanoparticles in the silicon-rich dielectric layer. Here, a diameter of the silicon nanoparticles ranges from 0.5 nm to 200 nm, for example. As such, the N-type doped silicon-rich dielectric layer 220 or the P-type doped silicon-rich dielectric layer 230 containing the silicon nanoparticles can be formed. The N-type doped silicon-rich dielectric layer 220 and the P-type doped silicon-rich dielectric layer 230 can have a relatively small thickness to that of the conventional silicon photo-voltaic device, for example, 100 nm to 500 nm, and sufficient photo-voltaic conversion efficiency can still be achieved. The photo-voltaic cell device 200 has better photo-voltaic conversion efficiency when the photo-voltaic cell device 200 is irradiated. Namely, in comparison with the conventional photo-voltaic cell device, the photo-voltaic cell device 200 is able to provide better photo-voltaic energy on the condition that the conventional photo-voltaic cell device and the photo-voltaic cell device 200 are exposed to the light with the same intensity. Note that favorable photo-voltaic conversion efficiency can also be accomplished by the photo-voltaic cell device 200 even though the N-type doped silicon-rich dielectric layer 220 and the P-type doped silicon-rich dielectric layer 230 do not contain the silicon nanoparticles. However, given that the N-type doped silicon-rich dielectric layer 220 and the P-type doped silicon-rich dielectric layer 230 contain the silicon nanoparticles, the photo-voltaic conversion efficiency of the photo-voltaic cell device 200 can be further improved. On the other hand, since the N-type doped silicon-rich dielectric layer 220 and the P-type doped silicon-rich dielectric layer 230 possess other elements such as hydrogen, oxygen, nitrogen, carbon, and so on, the lifetime and photo-voltaic stability can be enhanced and is not going to be deteriorated because of long-term use.

In the present embodiment, at least one of the first electrode 210 and the second electrode 240 is a transparent electrode for a vertical design. For instance, the first electrode 210 is a conductive electrode and can be made of aluminum, copper, titanium, molybdenum, tungsten, silver, gold, and so on. The second electrode 240 is a transparent electrode and can be made of indium tin oxide, indium zinc oxide, indium tin zinc oxide, hafnium oxide, zinc oxide, aluminum oxide, aluminum tin oxide, aluminum zinc oxide, cadmium tin oxide, cadmium zinc oxide, any other appropriate material, or a combination thereof. To be more specific, the N-type doped silicon-rich dielectric layer 220 and the P-type doped silicon-rich dielectric layer 230 are irradiated, so as to generate the free electron-hole pairs in the N-type doped silicon-rich dielectric layer 220 and the P-type doped silicon-rich dielectric layer 230. The electrons and the holes are seperated and respectively moved toward the positive doped layer (e.g. the P-type doped silicon-rich dielectric layer 230) and the negative doped layer (e.g. the N-type doped silicon-rich dielectric layer 220) and aggregated. Namely, the N-type doped silicon-rich dielectric layer 220 and the P-type doped silicon-rich dielectric layer 230 are doped with different ions, and an internal electric field (not shown) is formed between the N-type doped silicon-rich dielectric layer 220 and the P-type doped silicon-rich dielectric layer 230. Thereby, the electrons and the holes are respectively attracted. In addition, the first electrode 210 is electrically connected to the N-type doped silicon-rich dielectric layer 220, and the second electrode 240 is electrically connected to the P-type doped silicon-rich dielectric layer 230. Therefore, when the first electrode 210 and the second electrode 240 are coupled to a load circuit, a photo-voltaic current is generated to drive the load circuit. Here, the photo-voltaic current is changed along with different intensities of light which irradiates the photo-voltaic cell device 200.

That is to say, given that at least one of the first electrode 210 and the second electrode 240 is the transparent electrode, the N-type doped silicon-rich dielectric layer 220 or the P-type doped silicon-rich dielectric layer 230 can then be irradiated by an external light beam, such that the free electron-hole pairs can be generated in the N-type doped silicon-rich dielectric layer 220 or the P-type doped silicon-rich dielectric layer 230 which senses the external light beam. Here, the first electrode 210 and the second electrode 240 are made of indium tin oxide, indium zinc oxide, indium tin zinc oxide, hafnium oxide, zinc oxide, aluminum oxide, aluminum tin oxide, aluminum zinc oxide, cadmium tin oxide, cadmium zinc oxide, any other appropriate material, or a combination thereof, for example. Besides, the first electrode 210 and the second electrode 240 can both be the transparent electrodes.

As discussed above, after the N-type doped silicon-rich dielectric layer 220 and the P-type doped silicon-rich dielectric layer 230 in the photo-voltaic cell device 200 are irradiated, more free electron-hole pairs can be directly generated. Moreover, an internal electric field is generated between the N-type doped silicon-rich dielectric layer 220 and the P-type doped silicon-rich dielectric layer 230 to attract the holes and the electrons respectively. Thereby, a voltage potential difference exists between the first electrode 210 and the second electrode 240. As such, when the first electrode 210 and the second electrode 240 are connected to an external load circuit, flows of charges result in generation of the so-called photo-voltaic current, so as to drive the load circuit.

Accordingly, the photo-voltaic cell device 200 of the present embodiment can directly and spontaneously generate photo-voltaic energy which can be used by the external load circuit after the photo-voltaic cell device 200 is irradiated. Moreover, since the N-type doped silicon-rich dielectric layer 220 and the P-type doped silicon-rich dielectric layer 230 are made of silicon-rich materials, more free electron-hole pairs can be generated when the N-type doped silicon-rich dielectric layer 220 and the P-type doped silicon-rich dielectric layer 230 are irradiated, such that the photo-voltaic conversion efficiency of the photo-voltaic cell device 200 can be improved in an effective manner.

Figure 3:
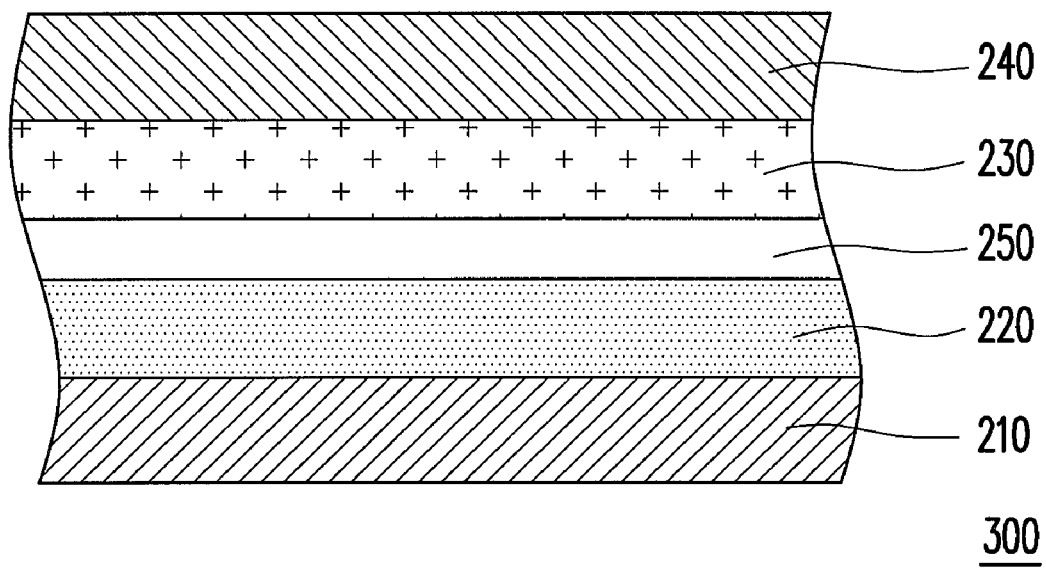
FIG. 3 is a schematic structural view of a photo-voltaic cell device according to another embodiment of the present invention.

FIG. 3 is a schematic structural view of a photo-voltaic cell device according to another embodiment of the present invention. Referring to FIG. 3, the photo-voltaic cell device 300 of the present embodiment is structurally similar to the photo-voltaic cell device 200, and the same reference numbers refer to the same components. The difference between the two photo-voltaic cell devices 300 and 200 lies in that the photo-voltaic cell device 300 further includes an intrinsic layer 250 (i.e. an undoped layer) disposed between the N-type doped silicon-rich dielectric layer 220 and the P-type doped silicon-rich dielectric layer 230.

According to the present embodiment, the intrinsic layer 250 can be made of a silicon-rich dielectric layer, amorphous silicon, polysilicon, or a combination thereof, for example. Preferably, the intrinsic layer 250 is made of undoped amorphous silicon, undoped polysilicon, or an undoped silicon-rich dielectric layer. Here, the silicon-rich dielectric layer can be a silicon-rich $SiO_x$ layer, a silicon-rich $SiN_y$ layer, a silicon-rich $SiO_xN_y$ layer, a silicon-rich $SiC_z$ layer, or a combination thereof. That is to say, when the photo-voltaic cell device 300 is irradiated, the free electron-hole pairs can be generated not only in the N-type doped silicon-rich dielectric layer 220 and the P-type doped silicon-rich dielectric layer 230 but also in the intrinsic layer 250. Likewise, the electrons and the holes are attracted by the internal electric field between the N-type doped silicon-rich dielectric layer 220 and the P-type doped silicon-rich dielectric layer 230, such that a voltage difference exists between the first electrode 210 and the second electrode 240. Therefore, after the photo-voltaic cell device 300 of the present embodiment is irradiated, the photo-voltaic cell device 300 is able to convert the light energy into the electric energy. Namely, the photo-voltaic cell device 300 is capable of supplying the electric energy.

In the photo-voltaic cell device 300, the free electron-hole pairs can also be generated after the intrinsic layer 250 is irradiated. Therefore, on the condition of the same irradiation, an increased amount of free electron-hole pairs can be generated in the photo-voltaic cell device 300. Owing to the increased amount of the free electron-hole pairs aggregating at the first electrode 210 and the second electrode 240, the voltage potential difference between the first electrode 210 and the second electrode 240 are increased, and the photo-voltaic cell device 300 can be more capable of supplying the electric energy. Namely, the photo-voltaic cell device 300, after being irradiated, not only has the advantages of the photo-voltaic cell device 200, but also achieves better photo-voltaic conversion efficiency or has greater photo-voltaic energy. Additionally, the N-type doped silicon-rich dielectric layer 220 and the P-type doped silicon-rich dielectric layer 230 have better photo-voltaic stability and thermal stability than those of a conventional doped amorphous silicon layer or a conventional doped polysilicon layer. Hence, the required thickness of film layers in the photo-voltaic cell device 300 can be relatively small, and it is more likely to integrate the photo-voltaic cell device 300 into a manufacturing process of a display panel.

Second Embodiment

Figure 4:
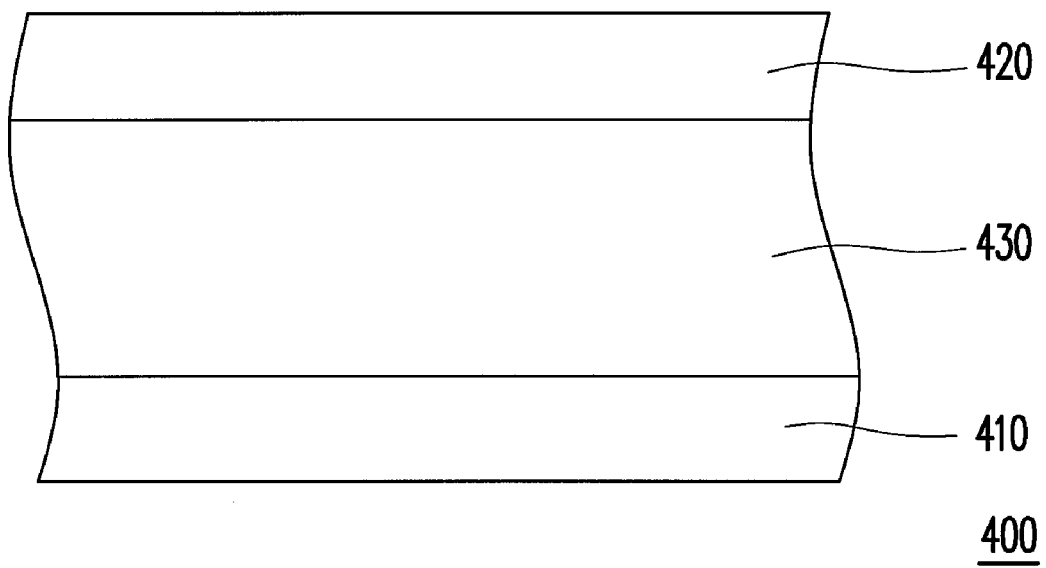
FIG. 4 is a schematic view of a display panel according to a second embodiment of the present invention.
Figure 5:
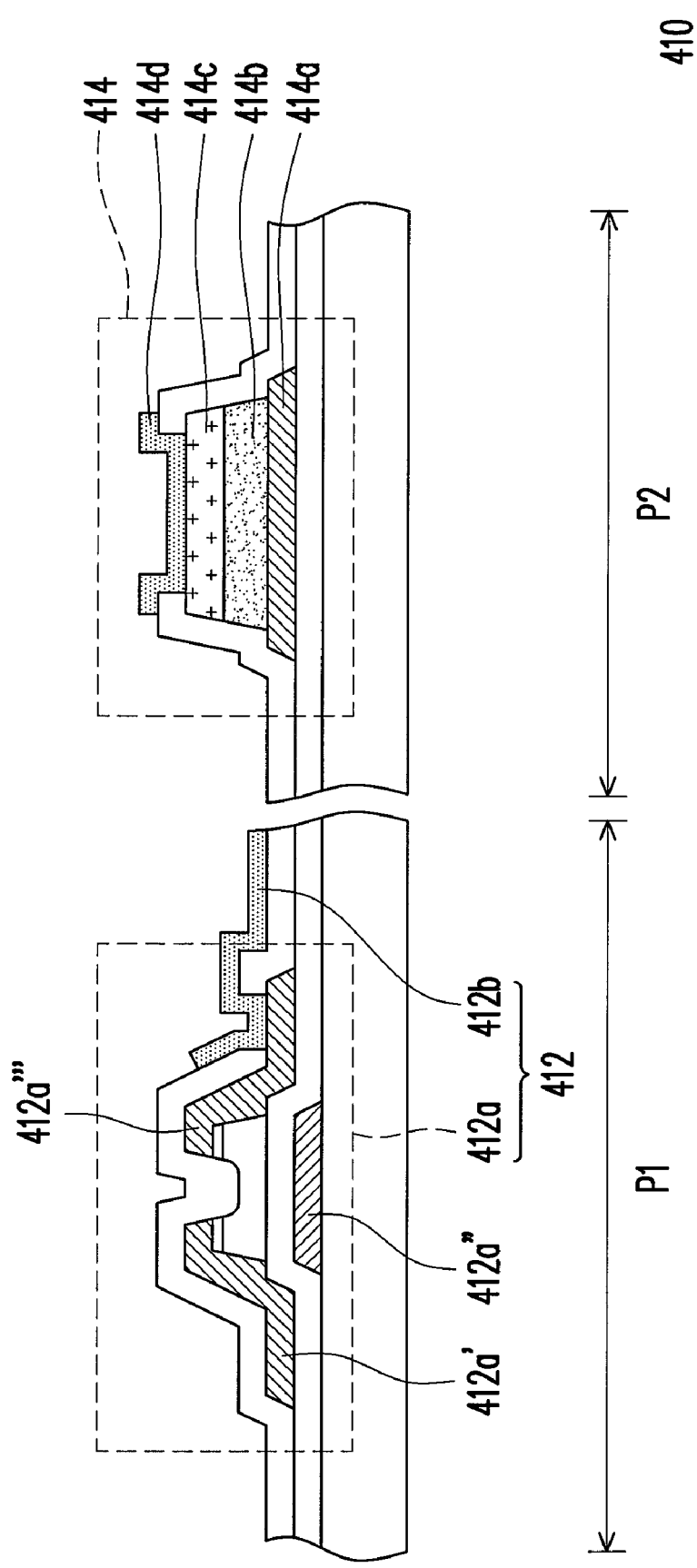
FIG. 5 is a schematic cross-sectional view of a first substrate depicted in FIG. 4.

FIG. 4 is a schematic view of a display panel according to a second embodiment of the present invention. FIG. 5 is a schematic cross-sectional view of a first substrate depicted in FIG. 4. Referring to FIGS. 4 and 5, the display panel 400 of the present embodiment has a pixel region P1 and a sensing region P2. The display panel 400 includes a first substrate 410, a second substrate 420, and a display medium 430 including such as a liquid crystal material, an organic light emitting material, an electrophoretic material, or the like. A pixel array 412 and at least a photo-voltaic cell device 414 are disposed on the first substrate 410. The pixel array 412 is disposed in the pixel region P1 and includes a plurality of TFTs 412a and a plurality of pixel electrodes 412b electrically connected to the TFTs 412a. The photo-voltaic cell device 414 is disposed in the sensing region P2 and includes a first electrode 414a, a first silicon-rich dielectric layer 414b, a second silicon-rich dielectric layer 414c, and a second electrode 414d. The first silicon-rich dielectric layer 414b such as an N-type doped silicon-rich dielectric layer, is disposed on the first electrode 414a and is doped with a first-type ion. The second silicon-rich dielectric layer 414c such as a P-type doped silicon-rich dielectric layer, is disposed on the first silicon-rich dielectric layer 414b and is doped with a second-type ion. The second electrode 414d is disposed on the second silicon-rich dielectric layer 414c. The second substrate 420 is disposed opposite to the first substrate 410. The display medium 430 is sandwiched between the first substrate 410 and the second substrate 420.

In the present embodiment, the film layer structure of the photo-voltaic cell device 414 is the same as that of the photo-voltaic cell device 200, for example. Specifically, for example, the first silicon-rich dielectric layer 414b doped with the first-type ion is made of the material of the N-type doped silicon-rich dielectric layer 220, and the second silicon-rich dielectric layer 414c doped with the second-type ion is made of the material of the P-type doped silicon-rich dielectric layer 230. The above description is merely exemplary. In consideration of the actual demands, the first silicon-rich dielectric layer 414b can also be made of the material of the P-type doped silicon-rich dielectric layer 230, and the second silicon-rich dielectric layer 414c can be made of the material of the N-type doped silicon-rich dielectric layer 220. Similarly, at least one of the first electrode 414a and the second electrode 414d is a transparent electrode. In the present embodiment, the second electrode 414d is the transparent electrode, and the transparent electrode can be made of the material described in the previous embodiment. Therefore, no further description is provided herein.

In an embodiment which is not depicted in the drawings, the film layer structure of the photo-voltaic cell device 414 can also be the same as that of the photo-voltaic cell device 300. That is to say, the photo-voltaic cell device 414 can further include an intrinsic layer (not shown) disposed between the first silicon-rich dielectric layer 414b and the second silicon-rich dielectric layer 414c. Besides, the intrinsic layer is made of the material of the intrinsic layer 250, for example.

Based on the above, no matter the photo-voltaic cell device 414 located in the sensing region P2 has the same film layer structure as that of the photo-voltaic cell device 200 or that of the photo-voltaic cell device 300, the photo-voltaic cell device 414 is still equipped with characteristics and advantages of the photo-voltaic cell devices 200 and 300 as provided in the previous embodiment. As such, when the display panel 400 having the photo-voltaic cell device 414 is irradiated by an external light beam, an appropriate voltage source or an appropriate current source can be provided by the photo-voltaic cell device 414 for the display panel 400, such that the display panel 400 can reduce the power consumption.

Besides, in terms of designing a power source for driving the display panel 400, given that the photo-voltaic cell device 414 is electrically connected to one another in series, each of the photo-voltaic cell devices 414 can provide greater voltages for the display panel 400 after the photo-sensing operation of each of the photo-voltaic cell devices 414 is performed and the voltages are added together. For instance, when the required driving voltage within the display panel 400 is 3V, and each of the photo-voltaic cell devices 414 provides a voltage at 0.3V after the photo-sensing operation of each of the photo-voltaic cell devices 414 is performed, the driving voltage required by the display panel 400 can be supplied by connecting ten photo-voltaic cell devices 414 in series. Speaking of the serial electrical connection of each of the photo-voltaic cell devices 414, the first electrode 414a of the photo-voltaic cell device 414 is, for example, electrically connected to the second electrode 414d of the adjacent photo-voltaic cell device 414, which is similar to the serial electrical connection of normal batteries. Therefore, people having ordinary skill in the art would be able to understand the effect of adding the voltages obtained by the serial electrical connection of each of the photo-voltaic cell devices 414, and no further description is provided herein.

Additionally, the photo-voltaic cell devices 414 can also be electrically connected together in parallel, such that the photo-voltaic current generated by the photo-sensing operation of each of the photo-voltaic cell devices 414 can be added together. Thereby, a relatively large current can be provided for driving the display panel. Likewise, for instance, if the required current for driving internal circuits of the display panel 400 is 3 A, and each of the photo-voltaic cell devices 414 provides a photo-voltaic current at 0.3 A after the photo-sensing operation of each of the photo-voltaic cell devices 414 is performed, the required current of the display panel 400 can be supplied by electrically connecting ten photo-voltaic cell devices 414 in parallel. Speaking of the parallel electrical connection of each of the photo-voltaic cell devices 414, the first electrode 414a of each of the photo-voltaic cell devices 414 is, for example, electrically connected to an end of the load circuit, and the second electrode 414d of each of the photo-voltaic cell devices 414 is electrically connected to the other end of the load circuit. This parallel electrical connection of the photo-voltaic cell devices 414 is similar to that of normal batteries. Therefore, people having ordinary skill in the art would be able to understand the effect of adding currents obtained by the parallel electrical connection of each of the photo-voltaic cell devices 414, and no further description is provided herein.

According to the present embodiment, the pixel array 412 has a generally known bottom gate amorphous TFT (α-TFT) design, for example. In other words, the TFTs 412a are α-TFTs, for example, and each of the TFTs 412a has a source electrode 412a', a gate 412a", and a drain electrode 412a'''. Switching mechanism of the TFTs 412a in the display panel 400 is known to people having ordinary skill in the art, and therefore no further description is provided herein. Note that the source electrode 412a' and the drain electrode 412a''' of the TFT 412a and the first electrode 414a of the photo-voltaic cell device 414 can be in the same film layer in the display panel 400. That is to say, practically speaking, the first electrode 414a of the photo-voltaic cell device 414 can be formed during the fabrication of the source electrode 412a' and the drain electrode 412a''' of the TFT 412a, and therefore one manufacturing process of the photo-voltaic cell device 414 can be omitted. On the other hand, the TFTs 412a can also be polysilicon TFTs with a bottom gate structure or a top gate structure, and no further description is provided herein.

Besides, the pixel electrodes 412b electrically connected to the TFTs 412a and the second electrode 414d of the photo-voltaic cell device 414 can be in the same film layer in the display panel 400, as shown in FIG. 5. Namely, practically speaking, the second electrode 414d of the photo-voltaic cell device 414 can be formed during the fabrication of the pixel electrodes 412b, and therefore another manufacturing process of the photo-voltaic cell device 414 can be omitted as well.

Based on the above, some film layers in the photo-voltaic cell device 414 can be formed together with the fabrication of the source electrodes 412a' of the TFTs 412a, the drain electrodes 412a''' thereof, and the pixel electrodes 412b, so as to reduce manufacturing processes of the photo-voltaic cell device 414. In addition, since the irradiated first silicon-rich dielectric layer 414b and the irradiated second silicon-rich dielectric layer 414c can have the increased photo-voltaic conversion efficiency, the required thickness of film layers in the photo-voltaic cell device 414 can be relatively small, and it is more likely to integrate the photo-voltaic cell device 414 into the display panel 400.

According to an embodiment, a color filter film (not shown) can be further disposed on one of the second substrate 420 and the first substrate 410. For instance, when the color filter film is disposed on the first substrate 410, the display panel 400 can have a color-filter-on-array design, an array-on-color-filter design, or any other appropriate design. In the present embodiment, the color filter film is, for example, formed on the second substrate 420, such that the second substrate 420 is a color filter substrate. Certainly, whether the color filter film is disposed on the first substrate 410 or on the second substrate 420 is determined upon actual demands and is not limited in the present invention. On the other hand, in the present embodiment, the display medium 430 disposed between the first substrate 410 and the second substrate 420 is, for example, a liquid crystal layer, an organic light emitting layer, a electrophoretic layer, or the like.

Third Embodiment

Figure 6:
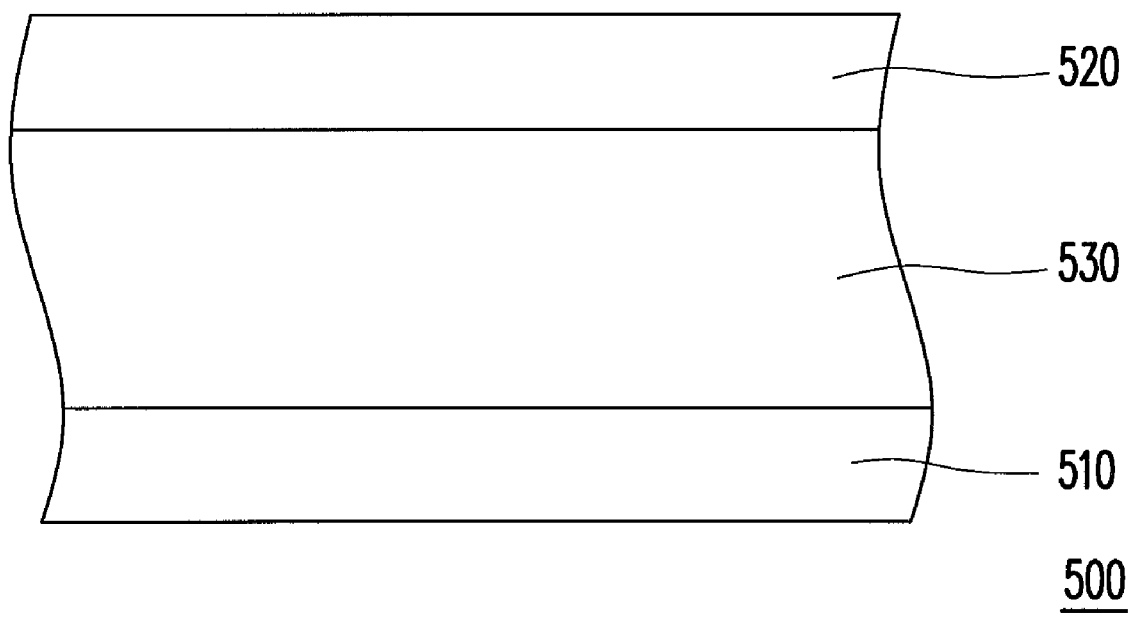
FIG. 6 is a schematic view of a display panel according to a third embodiment of the present invention.
Figure 7:
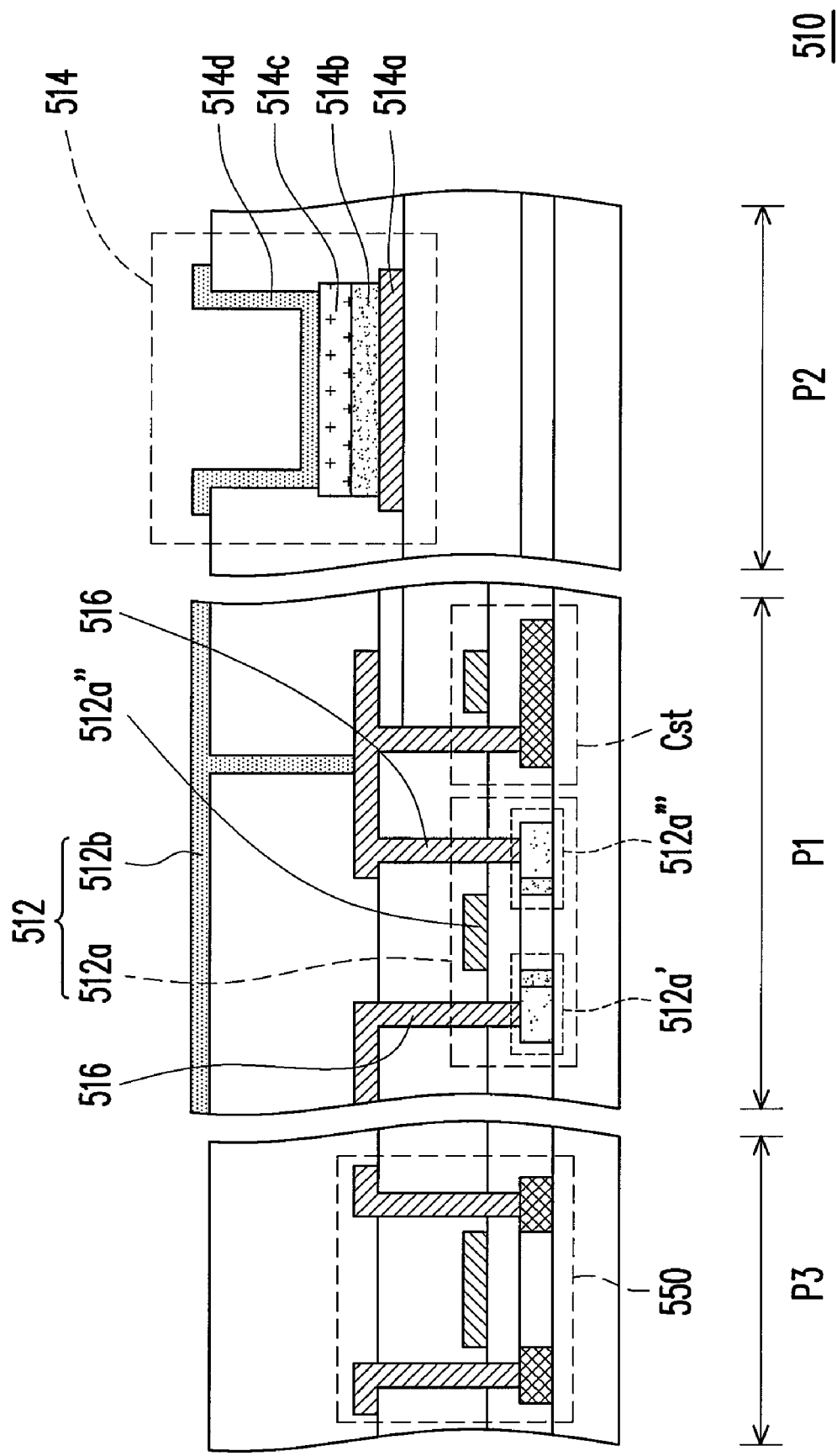
FIG. 7 is a schematic cross-sectional view of a first substrate depicted in FIG. 6.

FIG. 6 is a schematic view of a display panel according to a third embodiment of the present invention. FIG. 7 is a schematic cross-sectional view of a first substrate depicted in FIG. 6. Referring to FIGS. 6 and 7, the display panel 500 of the present embodiment has a pixel region P1 and a sensing region P2. The display panel 500 includes a first substrate 510, a second substrate 520, and a display medium 530. A pixel array 512 and at least a photo-voltaic cell device 514 are disposed on the first substrate 510. The pixel array 512 is disposed in the pixel region P1 and includes a plurality of TFTs 512a and a plurality of pixel electrodes 512b electrically connected to the TFTs 512a. The photo-voltaic cell device 514 is disposed in the sensing region P2 and includes a first electrode 514a, a first silicon-rich dielectric layer 514b, a second silicon-rich dielectric layer 514c, and a second electrode 514d. The first silicon-rich dielectric layer 514b is disposed on the first electrode 514a and is doped with a first-type ion. The second silicon-rich dielectric layer 514c is disposed on the first silicon-rich dielectric layer 514b and is doped with a second-type ion. The second electrode 514d is disposed on the second silicon-rich dielectric layer 514c. The second substrate 520 is disposed opposite to the first substrate 510. The display medium 530 is sandwiched between the first substrate 510 and the second substrate 520.

According to the present embodiment, the photo-voltaic cell device 514 refers to the aforesaid photo-voltaic cell device 414, the first substrate 510 refers to the aforesaid first substrate 410, and the display medium 530 refers to the aforesaid display medium 430, for example. Hence, relevant descriptions and advantages are provided in the previous embodiment and are not further discussed herein.

Besides, referring to FIGS. 4, 5, 6, and 7, in the display panel 500, a concept of integrating the photo-voltaic cell device 414 into the display panel 400 is applied, while the difference between the display panels 500 and 400 lies in that the pixel array 512 located in the pixel region P1 of the display panel 500 has a well-known low-temperature polysilicon (LTPS) TFT design. That is to say, the TFTs 512a are, for example, polysilicon TFTs, and each of the TFTs 512a has a source electrode 512a', a gate 512a'', and a drain electrode 512a'''. Switching mechanism of the TFTs 512a in the display panel 500 is known to people having ordinary skill in the art, and therefore no further description is provided herein. Likewise, metal contact plugs 516 electrically connected to the source electrode 512a' and the drain electrode 512a''' of the TFT 512a and the first electrode 514a of the photo-voltaic cell device 514 can be in the same film layer in the display panel 500. That is to say, practically speaking, the first electrode 514a of the photo-voltaic cell device 514 can be formed in the process of fabricating the metal plugs 516 electrically connected to the source electrode 512a' and the drain electrode 512a''' of the TFT 512a, and therefore one manufacturing process of the photo-voltaic cell device 514 can be omitted.

Besides, the pixel electrodes 512b electrically connected to the TFTs 512a and the second electrode 514d of the photo-voltaic cell device 514 can be in the same film layer, as shown in FIG. 7. Namely, practically speaking, the second electrode 514d of the photo-voltaic cell device 514 can be formed during the fabrication of the pixel electrodes 512b, and therefore another manufacturing process of the photo-voltaic cell device 514 can be omitted as well.

As a result, the display panel 500 also has the advantages of the display panel 400 where the photo-voltaic cell device 410 is integrated. Please refer to the previous embodiment in which relevant descriptions are provided. Note that the display panel 500 further includes a peripheral circuit region P3 located around the pixel region P1, and a plurality of active devices 550 are disposed in the peripheral circuit region P3. Here, the active devices 550 are, for example, P-type TFTs, N-type TFTs, or CMOS TFTs for driving the display panel 500, as indicated in FIG. 7.

Moreover, in the aforesaid display panel, the photo-voltaic cell device is integrated into an α-TFT display panel or an LTPS display panel, for example. Nonetheless, based on actual demands, the photo-voltaic cell device can also be integrated into the display panels enumerated hereinafter according to the present invention. The concepts and principles of integrating the photo-voltaic cell device into the display panel are discussed above and will not be further described herein.

In particular, the photo-voltaic cell device can be integrated into a transmissive display panel, a transflective display panel, a color-filter-on-array display panel, an array-on-color-filter display panel, a vertical alignment (VA) display panel, an in-plane-switch (IPS) display panel, a multi-domain vertical alignment (MVA) display panel, a twist nematic (TN) display panel, a super twist nematic (STN) display panel, a patterned-silt vertical alignment (PVA) display panel, a super patterned-silt vertical alignment (S-PVA) display panel, an advance super view (ASV) display panel, a fringe field switching (FFS) display panel, a continuous pinwheel alignment (CPA) display panel, an axially symmetric aligned micro-cell mode (ASM) display panel, an optical compensation bended (OCB) display panel, a super in plane switching (S-IPS) display panel, an advanced super in-plane-switch (AS-IPS) display panel, an ultra-fringe field switching (UFFS) display panel, a polymer stabilized alignment (PSA) display panel, a dual-view display panel, a triple-view display panel, or a three-dimensional display panel.

In light of the foregoing, the photo-voltaic cell device and the display panel of the present invention have at least the following advantages. First, since the N-type doped silicon-rich dielectric layer and the P-type doped silicon-rich dielectric layer are made of silicon-rich materials, more free electron-hole pairs can be generated when the N-type doped silicon-rich dielectric layer and the P-type doped silicon-rich dielectric layer are irradiated. Besides, the N-type doped silicon-rich dielectric layer and the P-type doped silicon-rich dielectric layer are doped with different ions, and therefore an internal electric field exists between the N-type doped silicon-rich dielectric layer and the P-type doped silicon-rich dielectric layer, such that the electrons and the holes are respectively attracted and moved to the P-type doped silicon-rich dielectric layer and the N-type doped silicon-rich dielectric layer, and the photo-voltaic cell device is allowed to provide photo-voltaic energy. Hence, the photo-voltaic cell device of the present invention has favorable photo-voltaic conversion efficiency. Additionally, the N-type doped silicon-rich dielectric layer and the P-type doped silicon-rich dielectric layer have improved photo-voltaic stability and thermal stability and thus have longer operation lifetime. Consequently, the required thickness of film layers in the photo-voltaic cell device can be relatively small, and it is more likely to integrate the photo-voltaic cell device into a manufacturing process of the display panel. As such, the display panel having the aforesaid photo-voltaic cell device is capable of effectively utilizing electric energy obtained during a photo-sensing operation of the photo-voltaic cell device, so as to reduce power consumption.

Though the present invention has been disclosed above by the embodiments, they are not intended to limit the present invention. Anybody skilled in the art can make some modifications and variations without departing from the spirit and scope of the present invention. Therefore, the protecting range of the present invention falls in the appended claims.

What is claimed is:

1. A photo-voltaic cell device, comprising:
a first electrode;
an N-type doped silicon-rich dielectric layer, disposed on the first electrode, wherein the N-type doped silicon-rich dielectric layer comprises a first silicon-rich dielectric material doped with an N-type dopant;
a P-type doped silicon-rich dielectric layer, disposed on the N-type doped silicon-rich dielectric layer, wherein the P-type doped silicon-rich dielectric layer comprises a second silicon-rich dielectric material doped with a P-type dopant; and
a second electrode, disposed on the P-type doped silicon-rich dielectric layer,
wherein each of the first silicon-rich dielectric material and the second silicon-rich dielectric material is respectively selected from Si-rich $SiO_x$, Si-rich $SiN_y$, Si-rich $SiO_xN_y$, Si-rich $SiC_z$, Si-rich $SiH_wO_x$, Si-rich $SiH_wN_y$, Si-rich $SiH_wO_xN_y$, or a combination thereof, wherein $0<w<4$, $0<x<2$, $0<y<1.34$, and $0<z<1$.

2. The photo-voltaic cell device as claimed in claim 1, further comprising an intrinsic layer disposed between the N-type doped silicon-rich dielectric layer and the P-type doped silicon-rich dielectric layer.

3. The photo-voltaic cell device as claimed in claim 2, wherein a material of the intrinsic layer comprises amorphous silicon, polysilicon, a silicon-rich dielectric layer, or a combination thereof.

4. The photo-voltaic cell device as claimed in claim 3, wherein the silicon-rich dielectric layer comprises a silicon-rich silicon oxide layer, a silicon-rich silicon nitride layer, a silicon-rich silicon oxynitride layer, a silicon-rich silicon carbide layer, or a combination thereof.

5. The photo-voltaic cell device as claimed in claim 1, wherein the N-type doped silicon-rich dielectric layer and the P-type doped silicon-rich dielectric layer further comprise silicon nanoparticles.

6. The photo-voltaic cell device as claimed in claim 1, wherein at least one of the first electrode and the second electrode is a transparent electrode.

7. The photo-voltaic cell device as claimed in claim 1, wherein the N-type dopant comprises nitrogen, phosphorous, arsenic, antimony, or bismuth.

8. The photo-voltaic cell device as claimed in claim 1, wherein the P-type dopant comprises boron, aluminum, gallium, indium, or thallium.

9. A photo-voltaic cell device, comprising:
a first electrode;
an N-type doped silicon-rich dielectric layer, disposed on the first electrode, wherein the N-type doped silicon-rich dielectric layer comprises a first silicon-rich dielectric material doped with an N-type dopant;
an intrinsic layer, disposed on the N-type doped silicon-rich dielectric layer;
a P-type doped silicon-rich dielectric layer, disposed on the intrinsic layer, wherein the P-type doped silicon-rich dielectric layer comprises a second silicon-rich dielectric material doped with a P-type dopant; and
a second electrode, disposed on the P-type doped silicon-rich dielectric layer,
wherein each of the first silicon-rich dielectric material and the second silicon-rich dielectric material is respectively selected from Si-rich $SiO_x$, Si-rich $SiN_y$, Si-rich $SiO_xN_y$, Si-rich $SiC_z$, Si-rich $SiH_wO_x$, Si-rich $SiH_wN_y$, Si-rich $SiH_wN_y$, or a combination thereof, wherein $0<w<4$, $0<x<2$, $0<y<1.34$, and $0<z<1$.

10. The photo-voltaic cell device as claimed in claim 9, wherein a material of the intrinsic layer comprises amorphous silicon, polysilicon, a silicon-rich dielectric layer, or a combination thereof.

11. The photo-voltaic cell device as claimed in claim 10, wherein the silicon-rich dielectric layer comprises a silicon-rich silicon oxide layer, a silicon-rich silicon nitride layer, a silicon-rich silicon oxynitride layer, a silicon-rich silicon carbide layer, or a combination thereof.

12. The photo-voltaic cell device as claimed in claim 9, wherein the N-type doped silicon-rich dielectric layer and the P-type doped silicon-rich dielectric layer further comprise silicon nanoparticles.

13. The photo-voltaic cell device as claimed in claim 9, wherein at least one of the first electrode and the second electrode is a transparent electrode.

14. The photo-voltaic cell device as claimed in claim 9, wherein the N-type dopant comprises nitrogen, phosphorous, arsenic, antimony, or bismuth.

15. The photo-voltaic cell device as claimed in claim 9, wherein the P-type dopant comprises boron, aluminum, gallium, indium, or thallium.

16. A display panel, having a pixel region and a sensing region, comprising:
a first substrate, comprising a pixel array and at least a photo-voltaic cell device disposed on the first substrate, the pixel array being disposed in the pixel region and comprising a plurality of thin film transistors and a plurality of pixel electrodes electrically connected to the plurality of thin film transistors, the at least a photo-voltaic cell device being disposed in the sensing region and comprising:
a first electrode;
a first silicon-rich dielectric layer, disposed on the first electrode, wherein the first silicon-rich dielectric layer comprises a first silicon-rich dielectric material doped with a first-type ion;

a second silicon-rich dielectric layer, disposed on the first silicon-rich dielectric layer, wherein the second silicon-rich dielectric layer comprises a second silicon-rich dielectric material doped with a second-type ion;

a second electrode, disposed on the second silicon-rich dielectric layer, wherein the first silicon-rich dielectric material and the second silicon-rich dielectric material are respectively selected from Si-rich $SiO_x$, Si-rich $SiN_y$, Si-rich $SiO_xN_y$, Si-rich $SiC_z$, Si-rich $SiH_wO_x$, Si-rich $SiH_wN_y$, Si-rich $SiH_wO_xN_y$, or a combination thereof, wherein $0<w<4$, $0<x<2$, $0<y<1.34$, and $0<z<1$;

a second substrate, disposed opposite to the first substrate; and a display medium, sandwiched between the first substrate and the second substrate.

17. The display panel as claimed in claim 16, wherein the plurality of pixel electrodes of the pixel array and the second electrode of the at least a photo-voltaic cell device are formed together in one film layer.

18. The display panel as claimed in claim 16, wherein each of the thin film transistors includes a gate electrode, a source electrode and a drain electrode, and source electrodes and drain electrodes of the plurality of thin film transistors and the first electrode of the at least a photo-voltaic cell device are formed together in one film layer.

19. The display panel as claimed in claim 16, wherein the plurality of thin film transistors includes amorphous silicon thin film transistors or polysilicon thin film transistors.

20. A photo-voltaic cell device, comprising:

a first electrode;

a second electrode;

an N-type doped silicon-rich dielectric layer, disposed between the first electrode and the second electrode, wherein the N-type doped silicon-rich dielectric layer comprises a first silicon-rich dielectric material doped with an N-type dopant; and a P-type doped silicon-rich dielectric layer, disposed between the N-type doped silicon-rich dielectric layer and the second electrode, wherein the P-type doped silicon-rich dielectric layer comprises a second silicon-rich dielectric material doped with a P-type dopant, wherein the first silicon-rich dielectric material and the second silicon-rich dielectric material are respectively selected from Si-rich $SiO_x$, Si-rich $SiN_y$, Si-rich $SiO_xN_y$, Si-rich $SiC_z$, Si-rich $SiH_wO_x$, Si-rich $SiH_wN_y$, Si-rich $SiH_wO_xN_y$, or a combination thereof, wherein $0<w<4$, $0<x<2$, $0<y<1.34$, and $0<z<1$.

21. The photo-voltaic cell device as claimed in claim 20, further comprising an intrinsic layer, the photo-voltaic cell device being disposed between the N-type doped silicon-rich dielectric layer and the P-type doped silicon-rich dielectric layer.

22. The photo-voltaic cell device as claimed in claim 20, wherein at least one of the first electrode and the second electrode is a transparent electrode.

23. A method of fabricating a photo-voltaic cell device, comprising:

forming a first electrode;

forming a second electrode;

forming an N-type doped silicon-rich dielectric layer, disposed between the first electrode and the second electrode, wherein the N-type doped silicon-rich dielectric layer comprises a first silicon-rich dielectric material doped with an N-type dopant; and forming a P-type doped silicon-rich dielectric layer, disposed between the N-type doped silicon-rich dielectric layer and the second electrode, wherein the P-type doped silicon-rich dielectric layer comprises a second silicon-rich dielectric material doped with a P-type dopant, wherein the first silicon-rich dielectric material and the second silicon-rich dielectric material are respectively selected from Si-rich $SiO_x$, Si-rich $SiN_y$, Si-rich $SiO_xN_y$, Si-rich $SiC_z$, Si-rich $SiH_wO_x$, Si-rich $SiH_wN_y$, Si-rich $SiH_wO_xN_y$, or a combination thereof, wherein $0<w<4$, $0<x<2$, $0<y<1.34$, and $0<z<1$.

* * * * *